United States Patent [19]
Shibata

[11] Patent Number: 5,834,793
[45] Date of Patent: Nov. 10, 1998

[54] SEMICONDUCTOR DEVICES

[75] Inventor: Tadashi Shibata, Yokohama, Japan

[73] Assignee: Kabushiki Kaisha Toshiba, Kawasaki, Japan

[21] Appl. No.: 681,570

[22] Filed: Jul. 23, 1996

Related U.S. Application Data

[63] Continuation of Ser. No. 338,209, Nov. 9, 1994, abandoned, which is a continuation of Ser. No. 218,705, Mar. 28, 1994, abandoned, which is a continuation of Ser. No. 76,176, Jun. 14, 1993, abandoned, which is a continuation of Ser. No. 955,794, Jun. 3, 1992, abandoned, which is a continuation of Ser. No. 774,731, Oct. 9, 1991, abandoned, which is a continuation of Ser. No. 626,331, Dec. 13, 1990, abandoned, which is a continuation of Ser. No. 309,011, Feb. 9, 1989, abandoned, which is a continuation of Ser. No. 945,827, Dec. 24, 1986, abandoned.

[30] Foreign Application Priority Data

| Dec. 27, 1985 | [JP] | Japan | 60-292512 |
| Apr. 9, 1986 | [JP] | Japan | 61-080057 |

[51] Int. Cl.$^6$ .................................................. H01L 29/06
[52] U.S. Cl. .............................. 257/25; 257/327; 257/401
[58] Field of Search .............................. 357/23.3; 257/25, 257/26, 27, 316, 319, 320, 327, 347, 379, 382, 401

[56] References Cited

U.S. PATENT DOCUMENTS

| 4,053,917 | 10/1977 | Blaha et al. | 357/6 |
| 4,096,509 | 6/1978 | Blaha et al. | 357/6 |
| 4,503,519 | 3/1985 | Arakawa | 357/23.5 |
| 4,665,414 | 5/1987 | Koeneke et al. | 357/23.1 |
| 4,675,711 | 6/1987 | Harder et al. | 357/23.2 |
| 4,689,869 | 9/1987 | Jambotkar | 357/23.2 |
| 4,721,983 | 1/1988 | Frazier | 257/25 |
| 4,780,749 | 10/1988 | Schulman | 257/14 |

FOREIGN PATENT DOCUMENTS

| 59-03381 | 6/1984 | Japan | 257/409 |
| 60-79776 | 5/1985 | Japan | 257/27 |

OTHER PUBLICATIONS

IBM Tech. Discl. Bul. vol. 17, No. 4, 1974 "Tunnel Transistor", Miersch., Sep. 1974.

*Electronic Circuiit Anal. and Design*, Hayt et al. pp. 151–152, 187–189. 1984., Dec. 1984.

*Physics of Semic. Devices*, S.M. Sze, pp. 250–254, 491–493, 1981., Dec. 1981.

Warren, et al, "Surface Superlattice Formation in Silicon Inversion Layers Using 0.2–μm Period Grating–Gate Electrodes", IEEE Electron Device Letters, vol. EDL–6, No. 6, Jun. 1985, pp.294–296.

Yokoyama et al, "A New Functional, Resonant–Tunneling Hot Electron Transistor (RHET)", Japanese Journal of Applied Physics, vol. 24, No. 11, Nov. 1985, pp. L853–L854.

*Primary Examiner*—Mark V. Prenty
*Attorney, Agent, or Firm*—Foley & Lardner

[57] ABSTRACT

A semiconductor device has a semiconductor substrate, a source and a drain region, each formed at the surface of said semiconductor substrate, and each having a potential barrier with respect to the semiconductor substrate. A gate electrode is formed on the semiconductor substrate and positioned between the source and drain regions. The gate electrode controls the height of discrete energy levels of carriers of said semiconductor substrate, and provides a conduction state and a non-conduction state depending upon the existence or non-existence of resonant tunneling current flow.

23 Claims, 19 Drawing Sheets

Resonant Tunneling Current

VG Gate Voltage

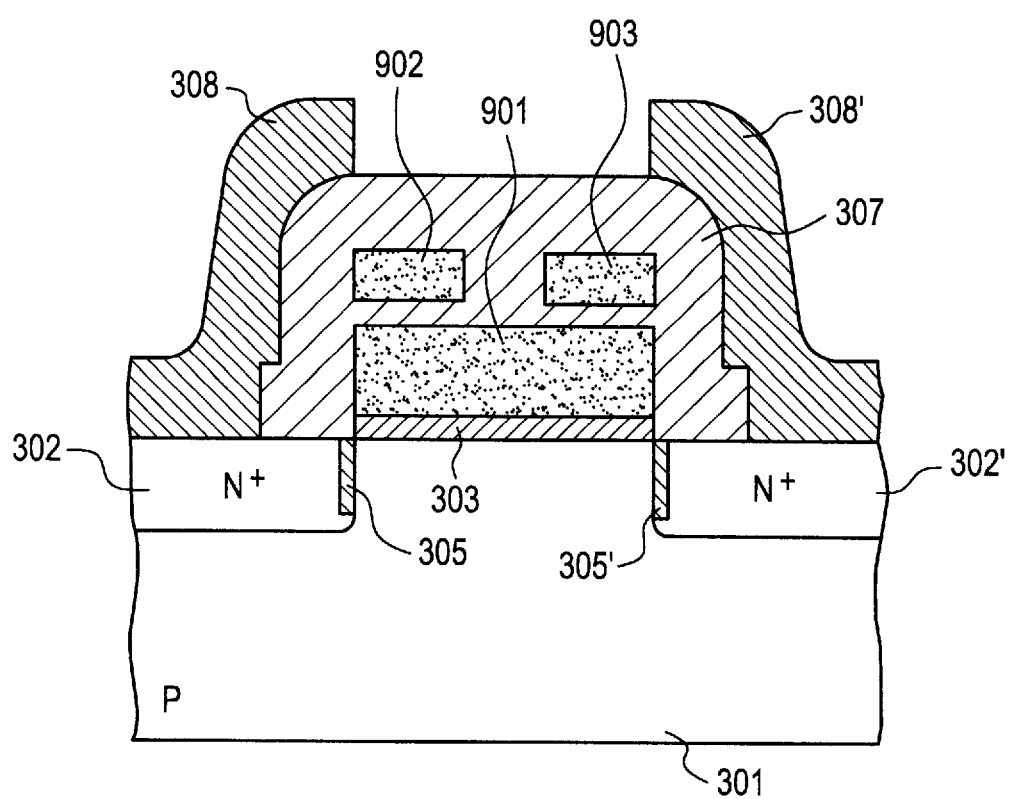

SEMICONDUCTOR DEVICES

This application is a continuation, of application Ser. No. 08/338,209, filed Nov. 9, 1994, now abandoned; which is a continuation of Ser. No. 08/218,705, filed Mar. 28, 1994, now abandoned; which is a continuation of Ser. No. 08/076, 176, filed Jun. 14, 1993, now abandoned; which is a continuation of Ser. No. 07/955,794, filed Jun. 3, 1992, now abandoned; which is a continuation of application Ser. No. 07/774,731, filed Oct. 9, 1991, now abandoned; which is a continuation of application Ser. No. 07/626,331, filed on Dec. 13, 1990, now abandoned; which is a continuation of application Ser. No. 07/309,011, filed Feb. 9, 1989, now abandoned; which is a continuation of application Ser. No. 06/945,827, filed Dec. 24, 1986, now abandoned.

BACKGROUND OF THE INVENTION

The invention relates to semiconductor devices, in particular, to resonant tunneling semiconductor devices.

Recently, in the area of compound semiconductor devices, devices having negative resistance characteristic have been investigated by means of a phenomena called resonant tunneling, using technology such as molecular beam epitaxy (MBE) and artificially providing potential wells and barriers.

FIG. 1a is a diagram showing a conventional resonant tunneling device. On an n-type GaAs substrate 101, there are formed Al x $Ga_{1-x}$ As (x≈30%) layers 102, 104 and a Ga As layer 103 each having a thickness of, for example, about 50 Å. Further, an n-type GaAs layer 105 is stacked thereon. The band gap of Al x $Ga_{1-x}$As is larger than that of GaAs; thus, the stacked construction has a band structure shown in FIG. 1b. FIG. 1b shows the lowest energy levels in the conduction bands in the stacked layers, and corresponds to the electron potential. The GaAs region 103' is bordered by the two potential barriers 102', 104', thereby forming a potential well. According to quantum mechanics, the electron energy levels contained in such a potential well are quantized into discrete levels having values denoted as E1, E2, ... in FIG. 1b. The gap between the discrete levels is inversely proportional to the square of the width of the potential well, for instance, about 100 mV when W is about 50 Å.

When a voltage is applied between n-type GaAs layers 101, 105, and when one of the energy levels in the region 103' is just coincident with the energy level of the region 101' as shown in FIG. 1c, electrons flow from 101' to 105'. This is the so-called resonant tunneling phenomena.

FIG. 2 is a diagram showing current-voltage characteristics of the device described above. Here, $V_1$ and $V_2$ respectively express the bias voltage needed to make levels $E_1$, $E_2$ coincident with level 101'. As shown in FIG. 2, the current-voltage characteristics of this device show a large nonlinearity. The device exhibits negative resistance as well.

Such a device can be used for a high frequency oscillator. However, the resonant tunneling device formed as stacked layers is difficult to achieve in a highly integrated form. This is because the device is formed in the longitudinal direction on the surface of the semiconductor substrate; thus, it is difficult to access the GaAs layer (for instance, 101) formed at a lower region, i.e., a region near the substrate. Therefore, it is desirable to form a resonant tunneling device which has current flow along the surface direction of the substrate. Furthermore, the prior art device is a two terminal device—therefore making it difficult to construct logic gates—so that the application of these devices has been restricted.

SUMMARY OF THE INVENTION

Accordingly, an object of the invention is to provide improved semiconductor devices using resonant tunneling.

Another object of the invention is to provide improved semiconductor devices having a current path along the surface of a semiconductor substrate.

Another object of the invention is to provide improved semiconductor devices with three terminals.

In accomplishing the foregoing objects there is provided according to one aspect of the invention a semiconductor device, comprising:

a semiconductor substrate;

a source region and a drain region each formed at the surface of said semiconductor substrate, said source and drain region respectively having a potential barrier against said semiconductor substrate; and a gate electrode formed on said semiconductor substrate positioned between said source and drain regions, said gate electrode controlling the light of discrete energy levels of carriers of said semiconductor substrate, and providing a conductive state and a non-conductive state depending on whether resonant tunneling current flows or not.

BRIEF DESCRIPTION OF THE DRAWINGS

The present invention, together with its various features and advantages, will be readily understood from the following more detailed description presented in conjunction with the following drawings, in which:

FIGS. 1b and 1c are diagrams for describing the resonant tunneling operation of the device in FIG. 1a;

FIG. 2 is a diagram showing current-voltage characteristics of the device described in FIG. 1a;

FIGS. 3b to 3e are diagrams showing electron potential diagrams of the device shown in FIG. 3a;

FIG. 4 is a diagram of the current-voltage characteristics of the device shown in FIG. 3a;

FIGS. 5a to 5c are diagrams showing cross-sectional views of an example of manufacturing steps for manufacturing the device shown in FIG. 3a;

FIG. 6 is a plan view of the device of FIG. 3a;

FIG. 8 is a diagram showing an operation of the resonant tunneling device used in the circuit of FIG. 7a;

FIGS. 9a to 9c are diagrams for describing another application of the resonant tunneling device of the present invention, in which exclusive logic adding is achieved;

FIGS. 11b to 11e are diagrams showing electron potential diagrams of the device shown in FIG. 11a;

FIG. 12 is a diagram of the current-voltage characteristics of the device shown in FIG. 11a;

FIGS. 13a to 13d are diagrams showing cross-sectional views of a manufacturing example for the device shown in FIG. 11a;

FIG. 14 is a plan view of the device of FIG. 11a;

DETAILED DESCRIPTION OF THE PREFERRED EMBODIMENTS

Figure 1A:
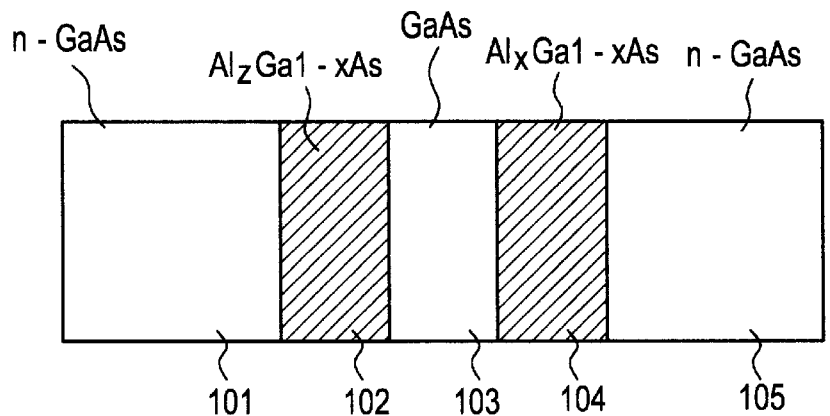
FIG. 1a is a diagram showing a conventional resonant tunneling device.
Figure 1B:
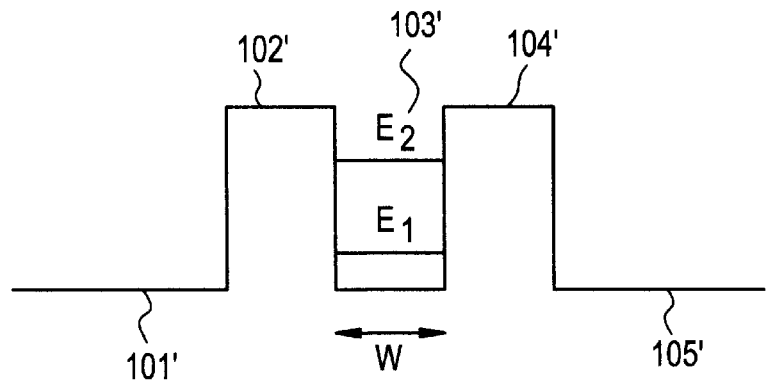
Figure 1C:
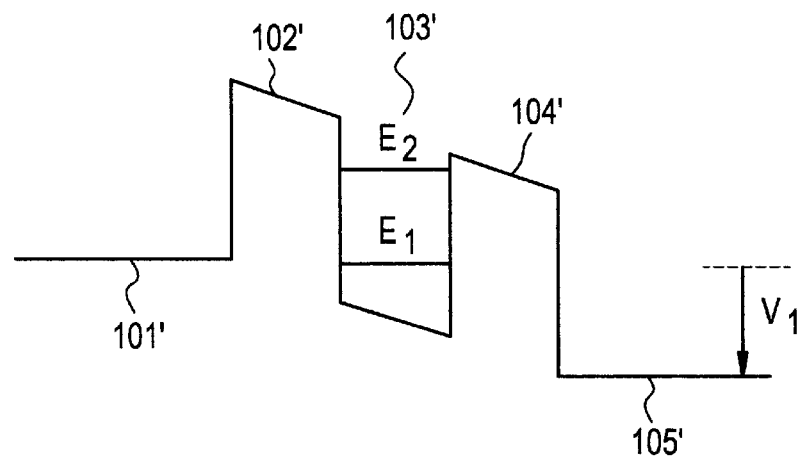
Figure 2:
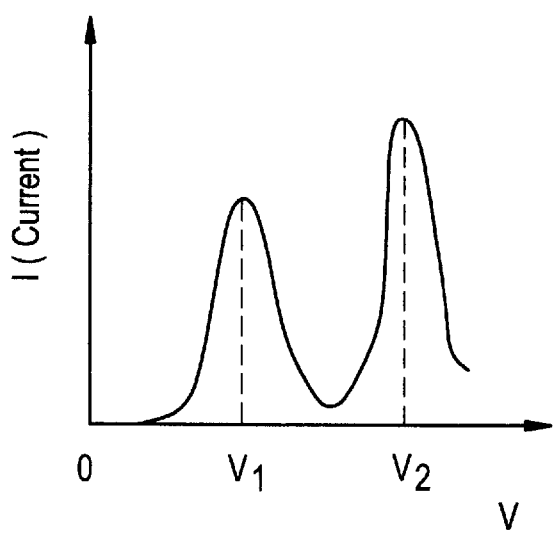
Figure 3A:
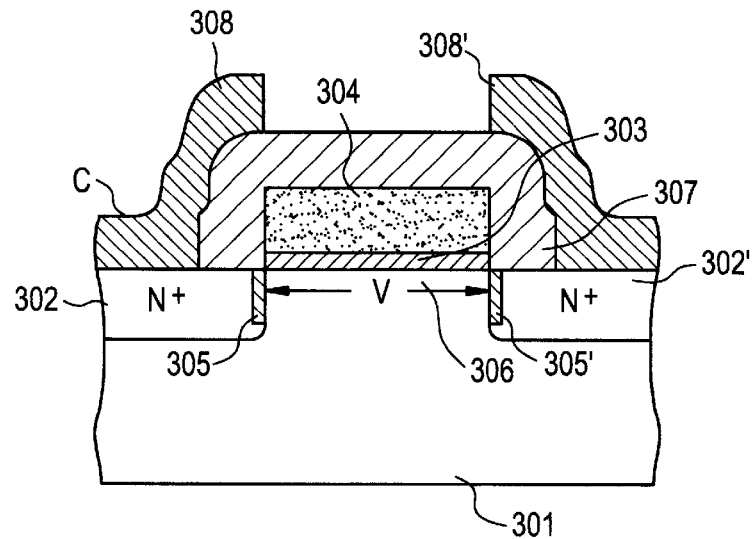
FIG. 3a is a diagram showing a cross sectional view of a resonant tunneling device of an embodiment of the present invention.

FIG. 3a is a diagram showing a cross-sectional view of a resonant tunneling device of an embodiment of the present invention. On a p-type Si substrate 301 having an acceptor concentration of about $10^{15} \sim 10^{16}$ cm$^{-3}$, n-type regions, namely, a source region 302 and a drain region 302' are formed spaced apart from each other. The concentration of impurities in the regions 302, 302' are, for example, $10^{18} \sim 10^{20}$ cm$^{-3}$. Further, on the substrate between source and drain regions 302, 302', a gate insulator (SiO$_2$) 303 with thickness of, for example, 100 Å through 300 521 and a gate electrode 304 are formed. Gate electrode 304 is, for instance, made of n-type poly-silicon. The numbers 305, 305' denote SiO$_2$ layers buried in Si substrate 301, which dissociate the regions 302, 302' from a surface region 306 of the Si substrate 301. The thickness of the SiO$_2$ layers 305 and 305' are made thinly enough to permit a flow of direct tunneling current when a voltage difference is applied between the source 302 and drain 302'. The layers are not thicker than 40 Å, for instance, about 30 Å each. The channel length L, defined as the distance between SiO$_2$ layers 305, 305', is not larger than 0.3 μm, and, for example, may typically be 0.01 μm. On the entire surface, a CVD SiO$_2$ film 307 is formed. The CVD SiO$_2$ film 307 has contact holes C (see FIG. 6), and Al electrodes 308, 308' are contacted with source and drain regions 302, 302' respectively.

FIGS. 3b to 3e are diagrams showing electron potentials against electrons at the surface of the device in FIG. 3a. These diagrams respectively show the lowest energy levels in the conduction bands in the source, surface region of the Si substrate, and the drain. Namely, number 302a in FIGS. 3b to 3e denotes the lowest energy level in the conduction band in the source. Similarly, the number 306a shows the lowest energy level in the conduction band in the surface region between source and drain 302, 302'. The number 302a' shows the lowest energy level in the conduction band in the drain 302'. The lowest energy levels in the conduction bands in source and drain region 302, 302' are equal the Fermi levels of the regions 302, 302' because the source and drain regions 302, 302' are n$^+$-type regions.

Figure 3B:
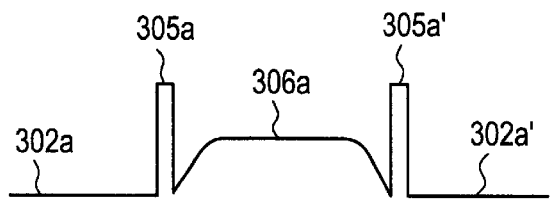
Figure 3C:
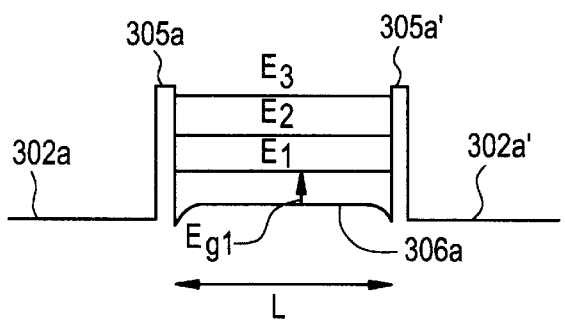

FIG. 3b shows the electron potential diagram when the gate voltage V$_G$ is equal to the flat band voltage. FIG. 3c shows the potential diagram when the gate voltage V$_G$ is made equal to the threshold voltage V$_{TH}$ of a MOSFET in which the SiO$_2$ layers 305, 305' are omitted from the device in FIG. 3a. In the device shown in FIG. 3a, current would not flow between source and drain regions even if V$_G$=V$_{TH}$. That is, the channel region 306 is spaced a part from the source and drain regions 302, 302' by means of the SiO$_2$ layers 305, 305' which provide potential barriers 305a, 305a'. Besides, because the channel length is not larger than 0.1 μm, the energy levels of electrons in the region 306 have quantized levels as denoted with E$_1$, E$_2$ ... shown in FIG. 3c.

The position E$_g$ of each energy level measured from the bottom of the potential well changes corresponding to the channel length. According to an approximate calculation, the potential energy E$_{g1}$ of energy level E$_1$, in the case L=0.05 μm, is 1.1 meV.

The following table shows other examples.

TABLE 1

|  | E$_1$ | E$_2$ | E$_3$ |  |
|---|---|---|---|---|
| L = 1000 Å | 0.3 | 1.1 | 2.5 |  |
| 500 Å | 1.1 | 4.4 | 9.9 |  |
| 300 Å | 3.1 | 12.2 | 27.5 |  |
| 100 Å | 28 | 110 | 248 | (meV) |

In FIG. 3c, the lowest energy level E$_1$ is above the level of source 302a even if V$_G$=V$_{TH}$, thus preventing the injection of electrons. Therefore, current will not flow between source and drain regions 302, 302'.

Figure 3D:
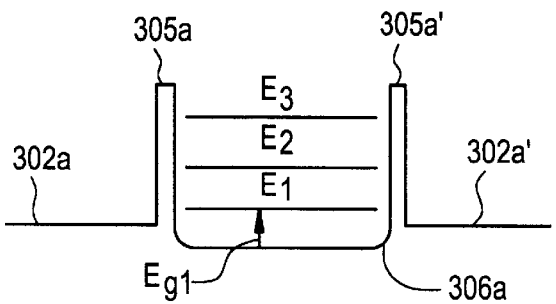
Figure 3E:
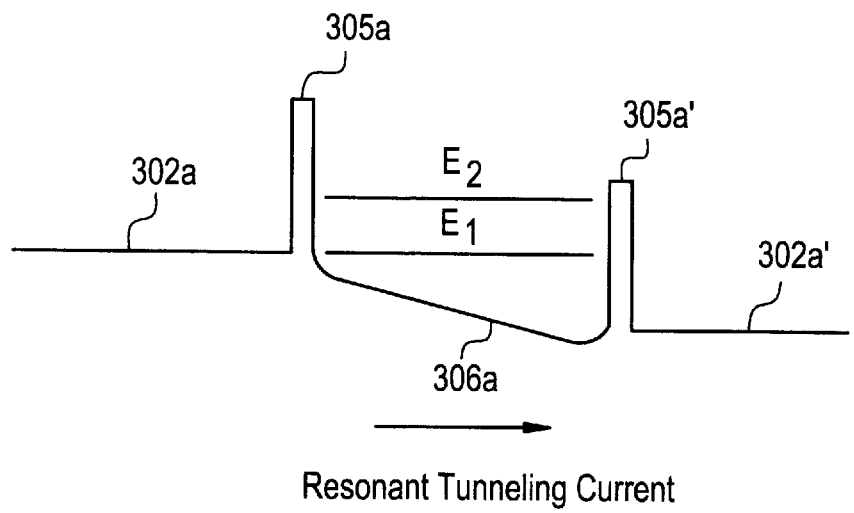

FIG. 3d shows a potential diagram for the case V$_G$>V$_{TH}$, which corresponds to a state of deep depletion. FIG. 3d shows that E$_1$ is coincident with the level (the lowest energy level in the conduction band) of the source, namely 302a, at a specific value of gate voltage, namely, V$_G$=V$_{G1}$. Here, when a slightly positive voltage with respect to the source is applied to the drain (V$_D \cong$ V$_S$), the current of the resonant tunneling phenomena flows from source region 302 to drain region 302'. In this case, the drain voltage V$_D$ is more significantly higher than the source V$_S$ the states become as shown in FIG. 3e, permitting resonant tunneling current to flow at a lower gate voltage (at which the E$_1$ level coincides with the level 302a in the source) than the case shown in FIG. 3d.

Figure 4:
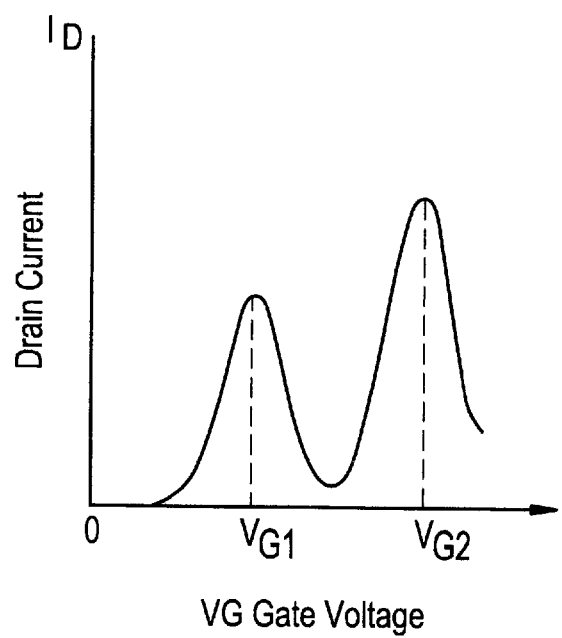

The current-voltage characteristics of the device shown in FIG. 3a are described in FIG. 4. V$_{G1}$ corresponds to the gate potential at which level E$_1$ is even with the source level 302a, V$_{G2}$ corresponding to E$_2$, etc.

The difference between the first embodiment of the present invention and the conventional device is as follows.

The conventional device is a two terminal device, and provides a negative resistance characteristic when a voltage is applied between the two terminals. However, according to one embodiment of the present invention, by controlling a voltage to the gate electrode as a third electrode, the current flows between the source and drain, and there arises a negative region of mutual conductance gm=(∂I$_D$/∂V$_G$). Thus, a conductive state and a nonconductive state are achieved.

For example, in the case in which the channel length L is 0.01 μm, the thickness of the gate oxide 303 is 100 Å, the width of the tunneling oxides 305, 305' are each 30 Å, acceptor concentration of the Si substrate is N$_A$=1×10$^{15}$ cm$^{-3}$ and the impurity concentration of the n-type poly-silicon gate 304 is over about 10$^{20}$ cm$^{-3}$. The gate voltage V$_{G1}$ needed to cause resonant tunneling current to flow in FIG. 3d is 0.076 V. In this case, the surface charge density V$_{SS}$ of gate oxide film 303 is 10$^{11}$ cm$^{-2}$. On the other hand, when the source voltage V$_S$ is 0 V and the drain voltage V$_D$ is 0.1 V, the value V$_{G1}$ shown in FIG. 3d is 0.026 V.

According to the embodiment described above, it is easy to take out the electrodes from each region as shown in FIG. 3a. Further, such a construction is suited to the construction logic gates.

Figure 5A:
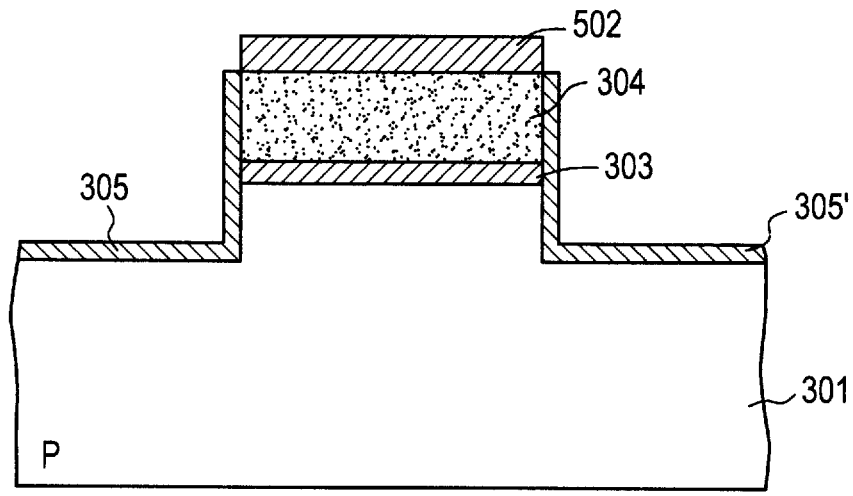
Figure 5B:
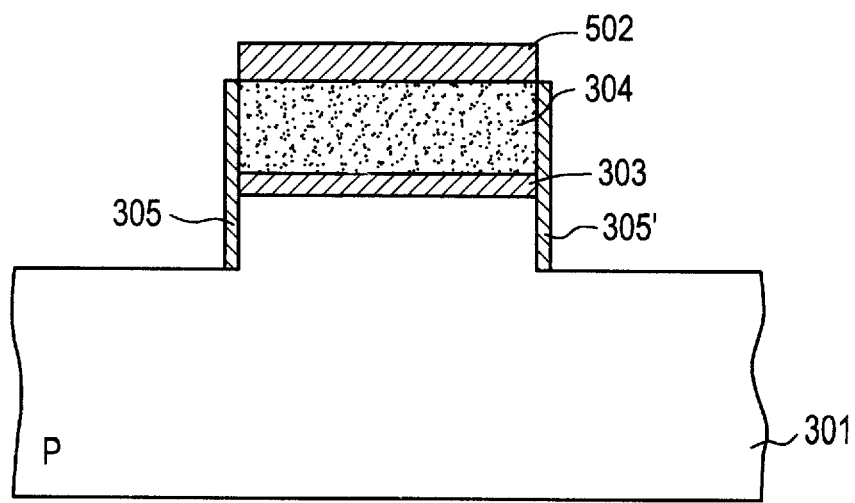
Figure 5C:
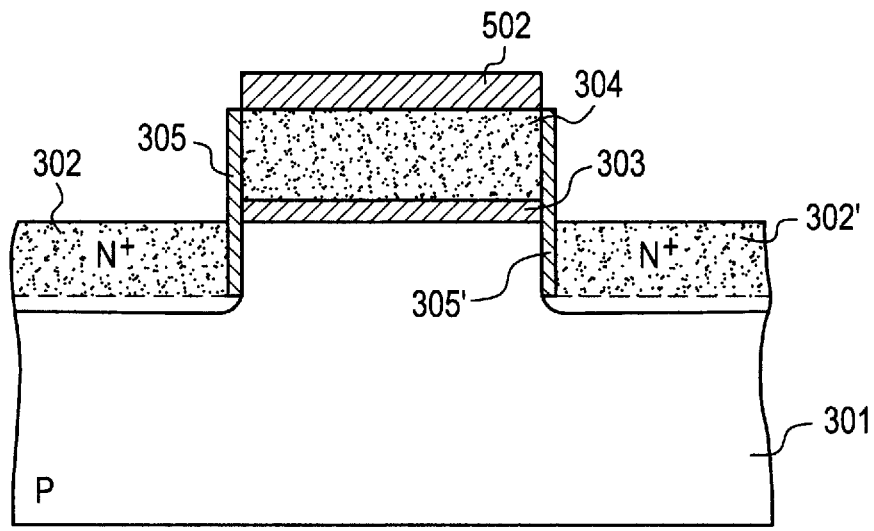
Figure 6:
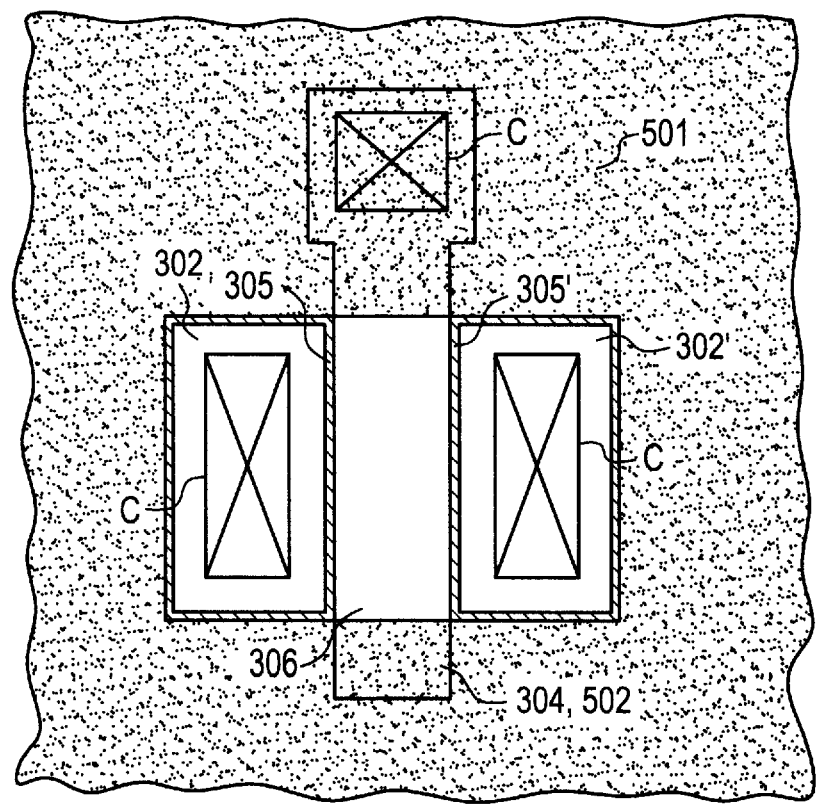

FIG. 5a to 5c are diagrams showing cross-sectional views of an example of manufacturing steps for manufacturing the device shown in FIG. 3a. FIG. 6 is a plan view of the device in FIG. 3a.

First of all, onto a p-type Si substrate 301, after forming a field insulating layer 501 (shown as doted region in FIG. b) a gate oxide film 303, a P (phosphorous) doped polysilicon film 304 and a $SiO_2$ film 502 are formed and then patterned to the gate electrode shape. Then, the Si substrate 301 surrounded by the insulating layer 501 is etched (i.e., by an RIE method) to form grooves. The gate electrode 304 is not etched. Next, the surfaces of the grooves are thermal oxidized in the order of 30 Å at, for instance, 850° C. in dry $O_2$+Aτ to form an oxide film 305, 3051 (FIG. 5a).

Then, the surface of the substrate is etched by performing the anisotropic etching method entirely, for instance by RIE, thus removing the oxide films 305, 305' positioned at the bottom of the grooves. The oxide films 305, 305' formed on the wall remain self-aligned. (FIG. 5b)

Next, a poly-silicon film containing As or P on the order of $10^{20}$ $cm^{-3}$ is formed so as to cover the substrate by the CVD method, and then a photo-resist film (not shown) is overlayed to make the surface flat. Then, the poly-silicon film and the photoresist film are etched at the entire surface by RIE and so forth, which etches both materials at almost the same speed. Accordingly, the poly-silicon film 302 and 302' are buried in the grooves. After this, preferably by performing a heat treatment, As or P are diffused into the substrate from the poly-silicon films 302 and 302' to form PN junction planes in the Si substrate 301. (FIG. 5c)

After that, a CVD $SiO_2$ film 307 is formed. Then, contact holes are opened, after which, Al electrodes for source, drain and gate electrode are formed as described in FIG. 3a.

FIG. 6 shows a plan view of the device. In FIG. 6, the buried oxide films 305, 305' are shown as shaded regions. The source and drain regions 302, 302' and the channel region 306 positioned therebetween are surrounded by the field oxide film 501 buried in the Si substrate 301.

In the embodiment described in FIGS. 5a to 5c, a polysilicon film was used to bury the grooves. However, a single silicon film, hydrogen-doped amorphous silicon and so forth may be adopted. Such a device has new and extremely wide applications. One example is shown in FIG. 7.

Figure 7A:
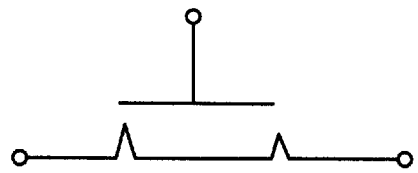
FIGS. 7a to 7d are diagrams showing an application of the device of FIG. 3a and describing the circuit operation in which output frequency is doubled as compared with input frequency.
Figure 7B:
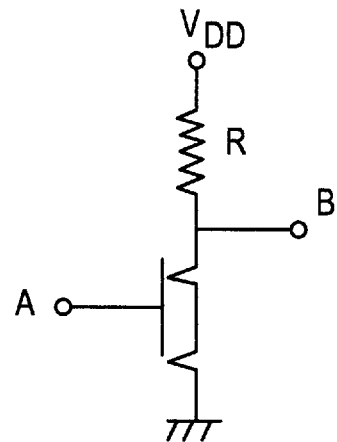
Figure 7C:
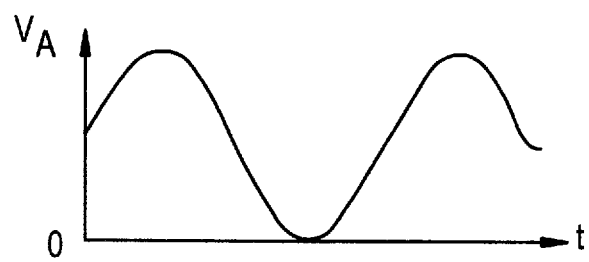
Figure 7D:
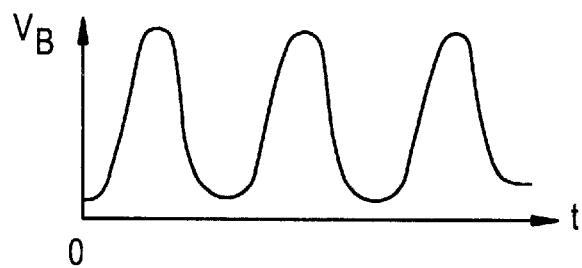

FIG. 7a is a diagram showing a representation of the device shown in FIG. 3a. FIG. 7b shows a circuit having a load resistor. By applying AC current having a frequency f to the terminal A of the circuit of FIG. 7b as shown in FIG. 7c, an output wave forms at the output terminal B having a frequency 2f as shown in FIG. 7d. Despite using only one active device, the output frequency is doubled.

Figure 8:
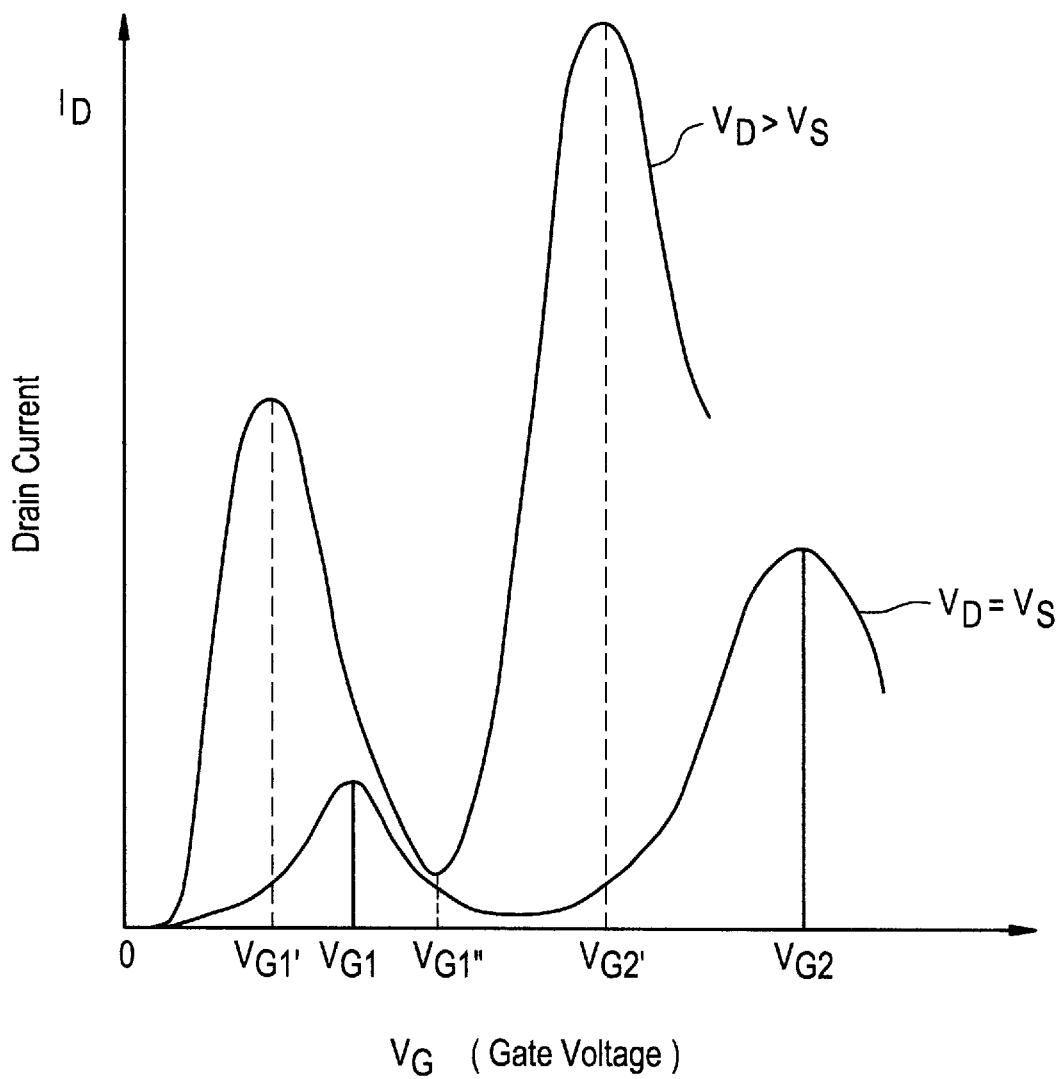

FIG. 8 is a diagram showing characteristics of the resonant tunneling device used in FIG. 7b. FIG. 8 shows two $I_d$ vs. $V_G$ curves, one for the drain voltage $V_D$ that is equal or nearly equal to the source voltage $V_S$ ($V_D \cong V_S$), and the other for $V_{D1}$ that is sufficiently larger than $V_S$ ($V_D > V_S$) so as to cause the potential diagram to be as shown in FIG. 3c. In reference to this FIG. 8, the operation of the circuit of FIG. 7b will be described as follows.

Let us assume, initially, that the input terminal A is Low and the output terminal B is at a High level. As the voltage of A (gate voltage) rises gradually and its level approaches the level $V_{G1'}$, which is the voltage needed to cause the resonant tunneling of level $E_1$ in the case $V_D > V_S$, current begins to flow, thus reducing the voltage at the terminal B. In other words, the voltage of $V_D$ approaches $V_S$. Then, further, the drain current output drops and continues to drop until the gate voltage $V_G$ reaches $V_{G1}$, which is the voltage necessary to cause resonant tunneling of $E_1$ in the case of $V_D \cong V_S$. Then, when the voltage of the input terminal A rises above $V_{G1}$, the output B begins to rise because the gate voltage goes through the resonant tunneling voltage. Further, when $V_G$ reaches the valley in the case $V_D > V_S$, namely $V_G \cong V_{G1}''$, the output B is again at a peak. In turn, as the input voltage falls and goes below $V_G = V_{G1}''$, the resonant tunneling current flows again; thus, the voltage of the output terminal B begins to fall. Then, the output lowers until the gate voltage $V_G$ becomes equal to $V_{G1}$, the gate voltage necessary to cause resonant tunneling in the case of $V_G \cong V_S$.

By repeating this cycle, the output frequency doubles, as shown in FIG. 7c and 7d. The input voltage at the terminal A repeats between the levels of 0 V and $V_{G1}''$.

As an example, in the case in which the channel length L is 0.01 μm, channel width W is 0.5 μm, gate oxide thickness is Å, tunneling oxide width is 30 Å and the resistivity of the resistor shown in FIG. 7b is 2 kΩ, the input signal is made 0 V~0.1 V. $V_{DD}$ is set at 0.1 V. The frequency of the input signal at the terminal A is set at, for example, 10 Hz~$10^6$ Hz.

FIG. 9a is a diagram showing the resonant tunneling device of another embodiment of the present invention. The same numbers are used for the corresponding parts shown in FIG. 3a. The $SiO_2$ film 307 electrically isolates control gates 902, 903 from a floating gate 901.

Figure 9B:
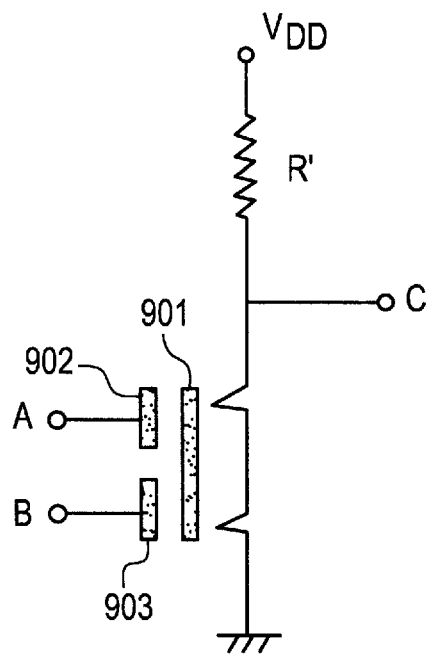

FIG. 9b is a circuit diagram in which the resonant tunneling device shown in FIG. 9a is used. In this diagram the gate electrode (corresponding to 304 in FIG. 3a) is made a floating gate 901 and there are provided two control gates 902, 903 that are capacitor-coupled with the floating gate 901. The circuit also shows a load resistor R'. The two control gates 902, 903 connect floating gate 901 with the same capacitor-coupling coefficient.

Figure 9C:
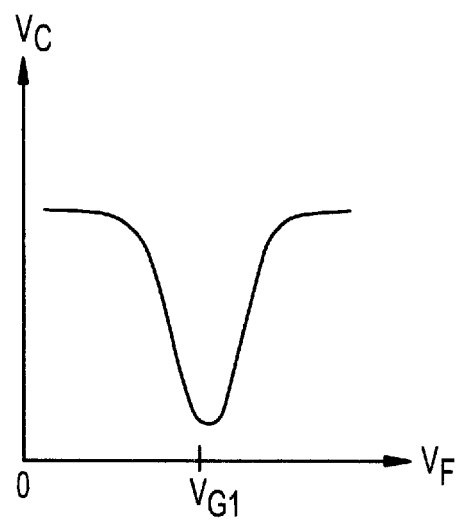

FIG. 9c is a diagram showing output wave forms of the floating gate voltage $V_F$. $V_{G1}$ is the peak voltage of the resonant tunneling current shown in FIG. 4.

Input voltages $V_A$, $V_B$, which input to the terminals A, B, respectively, can have either High or Low levels. By designing the device so that $V_F = V_{G1}$ when one of the control gates has a High level, and by providing that $V_F > V_{G1}$ in the case $V_A = V_B$=High, and $V_F < V_{G1}$ in the case $V_A = V_B$=Low, exclusive OR logic may be obtained. Table 2 shows these relationships.

TABLE 2

| $V_A$ | $V_B$ | $V_C$ |
|---|---|---|
| L | L | H |
| L | H | L |
| H | L | L |
| H | H | H |

In this embodiment, for example, the resistivity of R is 2 kΩ; and $V_{DD}$ is 0.1 V. The capacitance between the floating gate and the substrate is $3.4 \times 10^{-17}$ F, and the capacitance between the control gate and the floating gate is $1.7 \times 10^{-17}$ F. Further, the high and low levels of the input terminals A, B are, for instance, selected from 0 V and 0.1 V. The other parameters of the resonant tunneling device are the same as described in the embodiment of FIGS. 7a to 7e.

At least seven or eight active devices were needed using conventional devices; however, by using the resonant tunneling device described above, one can achieve the highly logical function mentioned with a single device.

Moreover, circuits that need a number of devices can be achieved with fewer devices, so that the power dissipation can be reduced and high speed circuits can be achieved—a result of the decrease in the number of wires between devices.

Further, the resonant tunneling device can be formed on a silicon substrate; thus, circuits having higher functions can be achieved by combination with SiMOS/LSI formed on the same substrate.

In the embodiment shown FIGS. 5a to 5c, the source and drain regions 302, 302' are formed by burying n-type silicon films. However, the process is not restricted to having the structure shown in FIG. 3a. It may be performed, for instance, by burying barrier oxide films into narrow grooves formed in the silicon substrate which is adjacent the gate electrode, and by As or P ion-implanting in the Si substrate to form source and drain regions, and thereafter annealing. Also, the gate electrode 304 and the gate oxide film 303 may be extended somewhat above the source and drain regions 302, 302'.

FIGS. 10a to 10f are diagrams showing other embodiments of the present invention.

Figure 10A:
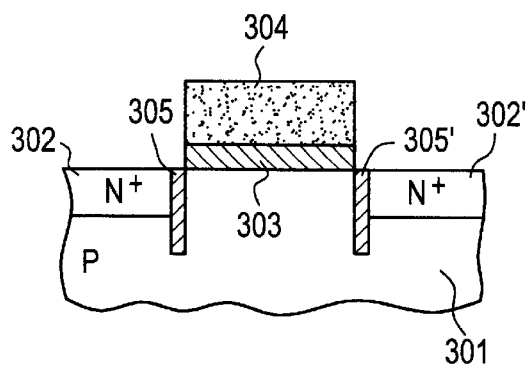
FIGS. 10a to 10f are diagrams showing cross-sectional views of other embodiments of the present invention.

FIG. 10a shows the case in which the tunneling oxide layers 305, 305' are formed more deeply than the PN junction planes of the source and drain regions 302, 302'. Although it is sufficient that the barrier oxide layers 305, 305' exist at the surface region of the semiconductor substrate, the same effect can be obtained by the structure shown in FIG. 10a.

This embodiment is similar to the embodiment depicted in FIG. 3a, in the respect that the n⁺-type region (302, 302') may be formed as polycrystalline or monocrystalline.

Figure 10D:
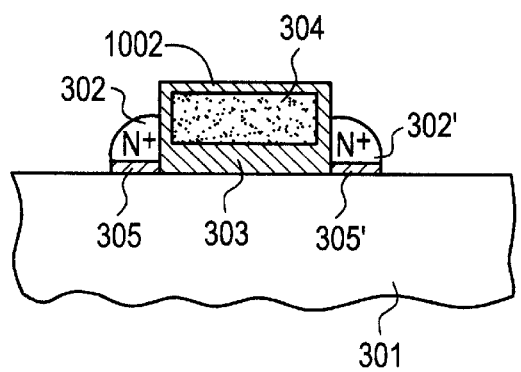
Figure 10B:
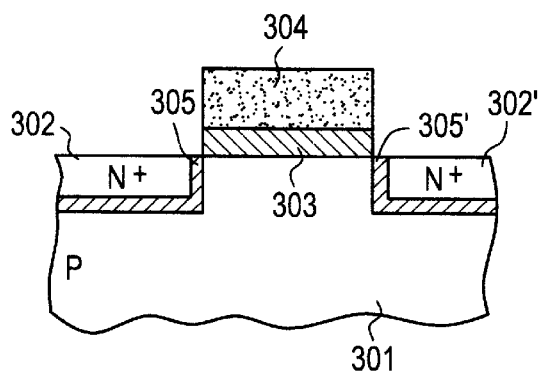

FIG. 10B shows a structure in which the barrier oxide films 305, 305' are formed along the entire interface of the PN junctions. In this case, the n⁺-type regions 302, 302' become poly-Si because of being formed on an oxide film, according to the usual manner. However, the n⁺-type regions 302, 302' may be formed as single Si regions by using the recrystallization method.

Figure 10E:
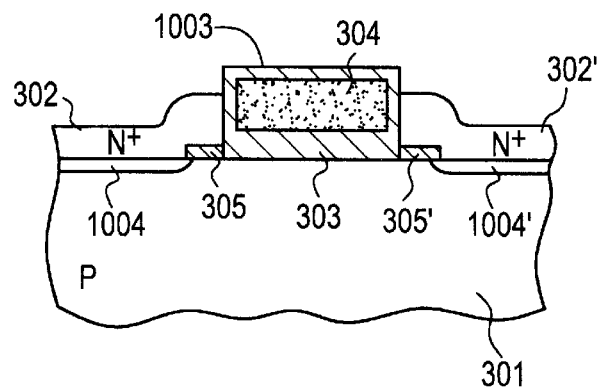
Figure 10C:
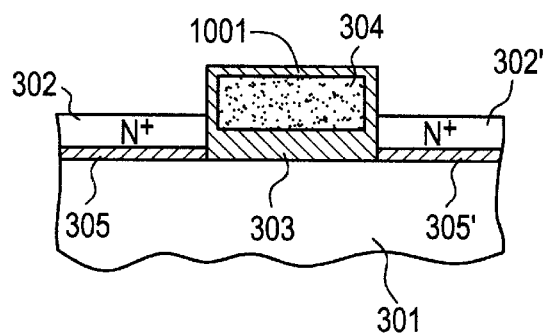

In the structure shown in FIG. 10c, the barrier oxide films 305, 305' are formed by oxidizing the surface of the Si substrate 301, and the n⁺-type regions 302, 302' are made of poly-Si deposited by the CVD method, etc. 1001 denotes an insulating film.

FIG. 10d shows a structure in which n⁺-type regions 302, 302' and barrier oxide film 305, 305' are formed only at the side wall portion of a gate electrode 304 after the gate electrode 304 has been covered with an insulating film 1002.

FIG. 10e is a device in which the surface of the gate electrode 304 is covered with an insulating film 1003, barrier oxide films 305, 305' are formed and the n⁺-type regions 302, 302' are formed with poly-Si films. The numbers 1004, 1004' denote PN junctions diffused from the poly-Si films 302, 302'. The extended portions of poly-Si films 302, 302' are used as wires, together with PN junctions 1004 and 1004'.

Figure 10F:
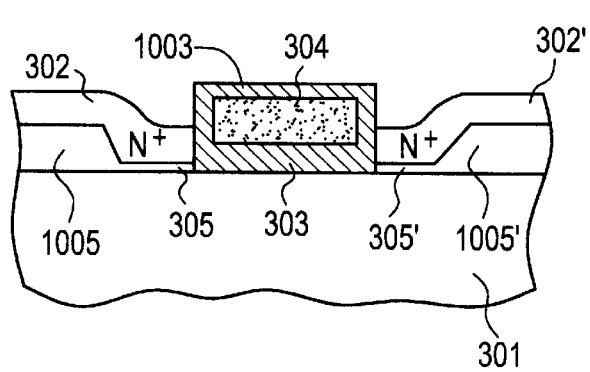

FIG. 10f is a device in which the barrier oxide films 305, 305' are formed at both sides of a gate electrode 304. Thick oxide films 1005, 1005' are formed in their (films 305, 305') outer regions, and the source and drain regions 302, 302' are formed with poly-Si films. The poly-Si films 302, 302' may be used as wires. In this embodiment, because of the thick oxide films 1005, 1005', coupling capacitance of the poly-Si films is reduced, so that high speed operation of the circuits can be accomplished. The source and drain regions 302, 302' in FIGS. 10a and 10c may also be used as wires.

In the embodiments of the present invention described above, oxide films 305, 305' are used as barrier insulation; however, other insulating films may be used. For example, silicon nitride films deposited by the CVD method may be used. In the case of silicon nitride, a thickness of about 40~50 Å can be used. Otherwise, aluminum oxide ($Al_2O_3$) and composite films therebetween may be used. Further, the materials otherwise insulated can be used when the materials generate a barrier.

Figure 11A:
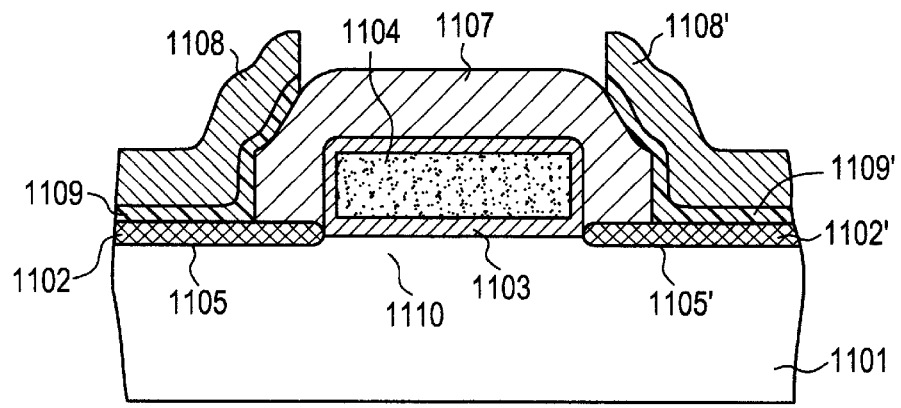
FIG. 11a is a diagram showing a cross-sectional view of a resonant tunneling device using a Shottoky barrier junction of an embodiment of the present invention.

FIG. 11a is a diagram showing a cross-sectional view of a resonant tunneling device of another embodiment of the invention. On a p-type Si substrate 1101 having an acceptor concentration of about $10^{15}$~$10^{16}$ cm$^{-3}$, platinum silicide (PtSi) films of a thickness of about 1000 Å are formed. These comprise a source region 1102 and a drain region 1102'. Further, on the substrate between source and drain regions 1102, 1102', a gate insulator ($SiO_2$) 1103 with a thickness of 100 Å~300 Å and a gate electrode 1104 are formed. The channel length L between the platinum silicide films of source and drain regions 1102, 1102' is not larger than 0.1 µm, for example, 0.01 µm. Gate electrode 1104 is, for example, made of n-type poly-silicon. Numbers 1105, 1105' represent interfaces between PtSi films 1102, 1102' and Si substrate 1101, in which potential barriers against holes, so-called Shottoky barriers, are provided. The Shottoky barriers serve the same purpose as the layers 305, 305' of FIG. 3a. A CVD $SiO_2$ film 1107 is formed onto the substrate. The CVD $SiO_2$ film 1107 has contact holes by which metal films 1109, 1109' and Al electrodes 1108, 1108' are contacted. As for the metal films 1109, 1109', one may use compounds such as Ti—W, preventing composition reaction between Al and PtSi.

FIGS. 11b to 11e are potential diagrams of the surface of the device of FIG. 11a. In FIGS. 11b to 11e, the number 1102a shows the Fermi level of the platinum silicide film 1102 (source). The number 1102a' shows the Fermi level of the silicide film 1102' (drain). Further, the number 1110a shows the lowest energy level in the conduction band in the surface region (channel region) 1110 between silicide films 1102 and 1102'. Similarly, the number 1110c shows the highest energy level in the valence band in the surface region 1110, and the number 110b is a Fermi level in the surface region 1110.

Figure 11B:
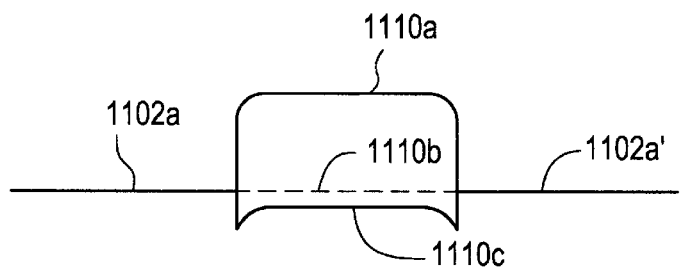
Figure 11C:
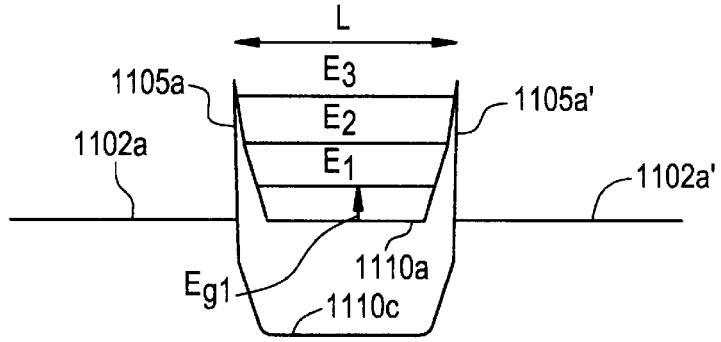

FIG. 11b shows the condition of the electron potential state in the case in which the gate voltage $V_G$ is equal to the flat band voltage. FIG. 11c shows a condition when the gate voltage $V_G$ is made equal to the threshold voltage $V_{TH}$ of a MOSFET in which n⁺-type regions of a source and a drain are formed instead of the platinum silicide films 1102, 1102'.

In the device shown in FIG. 11a, current will not flow between the source and drain regions even if $V_G = V_{TH}$. That is, the channel region 1110 is separated from source and drain regions 1102, 1102' by means of potential barriers (Schottky barriers) 1105a, 1105a', which are generated at the interfaces 1105, 1105'. The energy levels of electrons in the region 1110 have quantized levels as denoted with $E_1$, $E_2$ ... shown in FIG. 11c. The potential energy of energy levels $E_1, E_2$ ... are not changed as compared with Table 1.

Figure 11D:
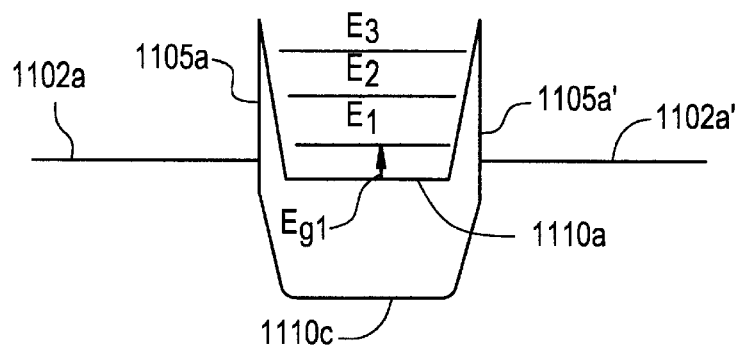
Figure 11E:
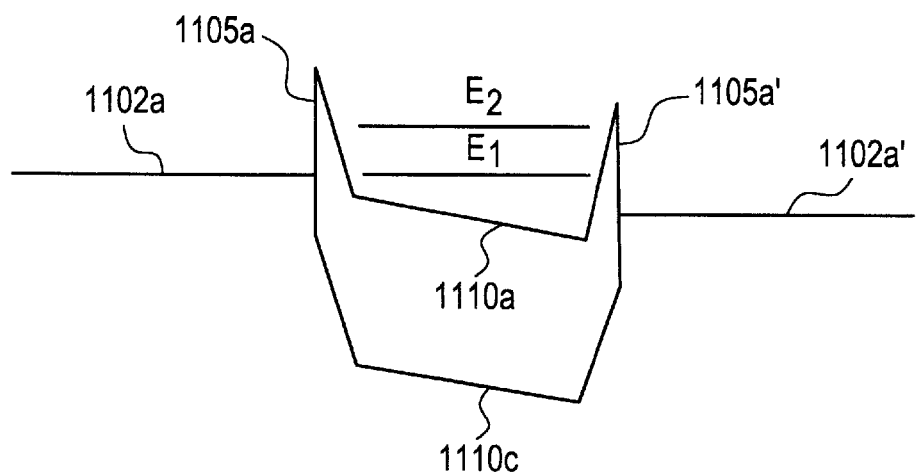

FIG. 11d shows the condition in which $V_G > V_{TH}$. This corresponds to a state of deep depletion. FIG. 11d shows that $E_1$ is coincident with the level of the source, namely 1102a, at $V_G = V_{G1}$. Here, when a slightly positive voltage with respect to the drain is applied to the source ($V_D \cong V_S$), the resonant tunneling current flows. Further, in the case in which the drain voltage $V_D$ is sufficiently higher than the source voltage $V_S$, the states becomes as shown in FIG. 3e, permitting resonant tunneling current to flow at a lower gate voltage in which the level $E_1$ coincides with the level 102a in the source.

In FIGS. 11b to 11e, the lowest energy level 1110a in the conduction band and the highest energy level 1110c in the valence band in the surface region 1110 are imaginary energy levels, both of which correspond to the energy levels in a MOSFET in which n+-type regions of a source and drain are formed rather than platinum silicide films. This is also similar to FIGS. 3b to 3e; that is, the lowest energy levels 306a shown in FIGS. 3b to 3e are imaginary energy levels, each corresponding to the energy level in a MOSFET having no barrier oxide films.

Figure 12:
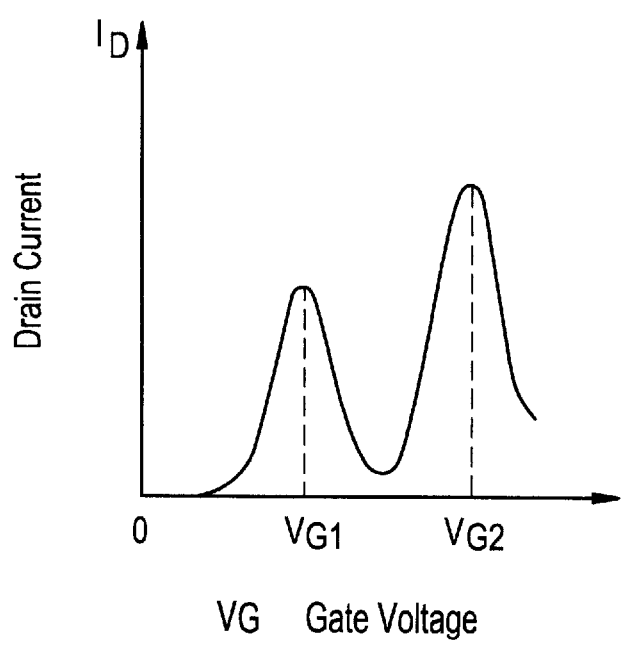

The current-voltage characteristics of the device of FIG. 11a are shown in FIG. 12.

FIGS. 13a to 13d are diagrams showing cross-sectional views of an example of steps which may be used in manufacturing the device shown in FIG. 11a.

Figure 13A:
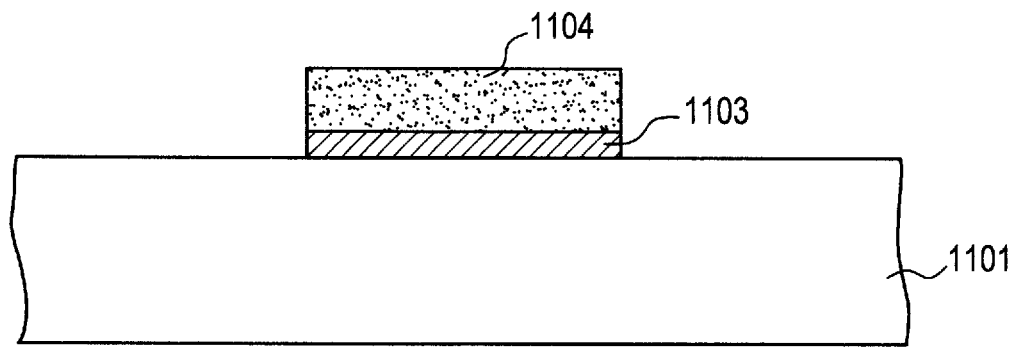
Figure 13B:
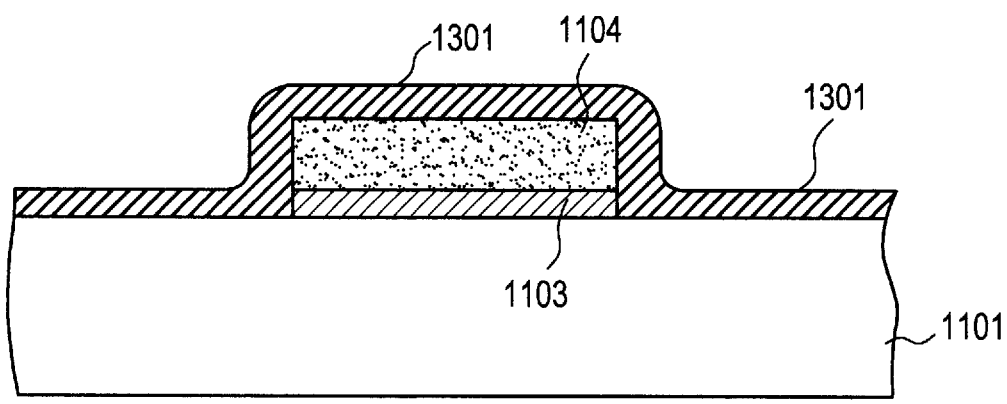
Figure 13C:
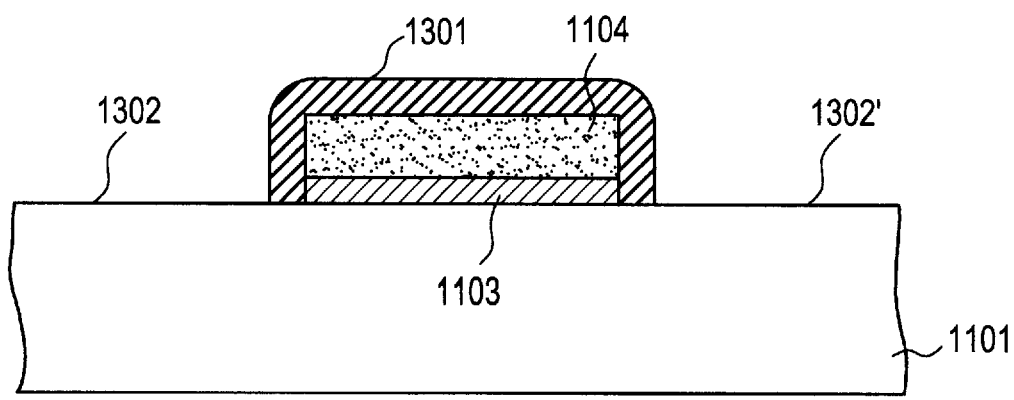

At first, onto a p-type Si substrate 1101, a gate oxide film 1103 and a gate electrode 1104 are formed as shown in FIG. 13a. The gate electrode 1104 is made from, for example, poly-silicon doped with phosphorous at a high concentration ($10^{20}$~$10^{21}$ cm$^{-3}$). The channel length L, is 0.01 μm (not to exceed 0.1 μm). Then, as shown in FIG. 13b, oxidation in a wet oxygen environment at 850° C. is performed. By this oxidation, a thick oxide film 1301 of 1000 Å~1500 Å thickness is grown on the poly-silicon electrode 1104 and a 200 Å~300 Å thickness of oxide film 1301 is grown on the surface of the Si substrate 1101. Then, by entirely etching the oxide film 1301 at 300 Å~400 Å with diluted HF solutions, a structure in which only the gate electrode is covered with the oxide film 1301 is obtained (FIG. 13c).

Figure 13D:
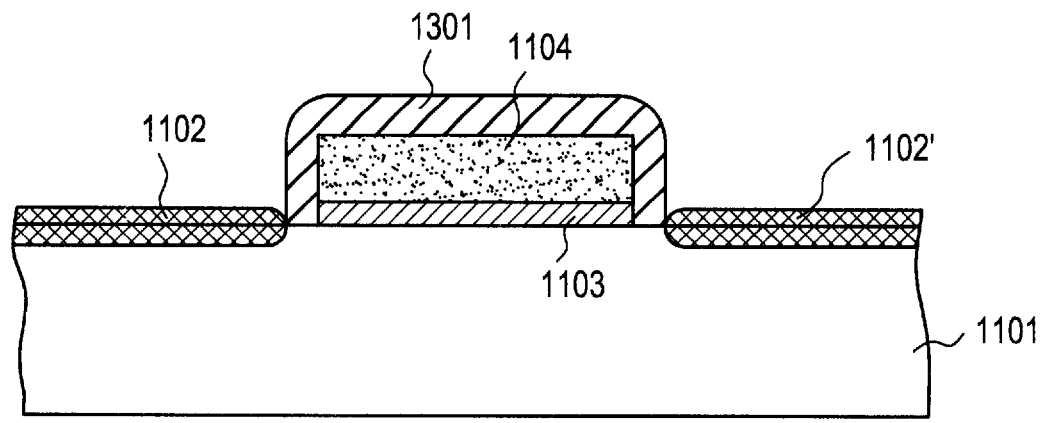

Next, a Pt (platinum) film of 500 Å thickness is vapor-deposited over the entire surface, and then an anneal treatment at 550° C. for 15 minutes is performed. Accordingly, only on the exposed portions 1302, 1302' of Si substrate 1101, are platinum silicide films 1102, 1102' of about 1000 Å thickness formed. Then, unreacted Pt films are removed with aqua regia, and thus the structure shown in FIG. 13d is obtained. Then, by forming a CVD SiO$_2$ film 1107, TiW films 1109, 1109' and Al electrodes, the device shown in FIG. 11a is manufactured.

Figure 14:
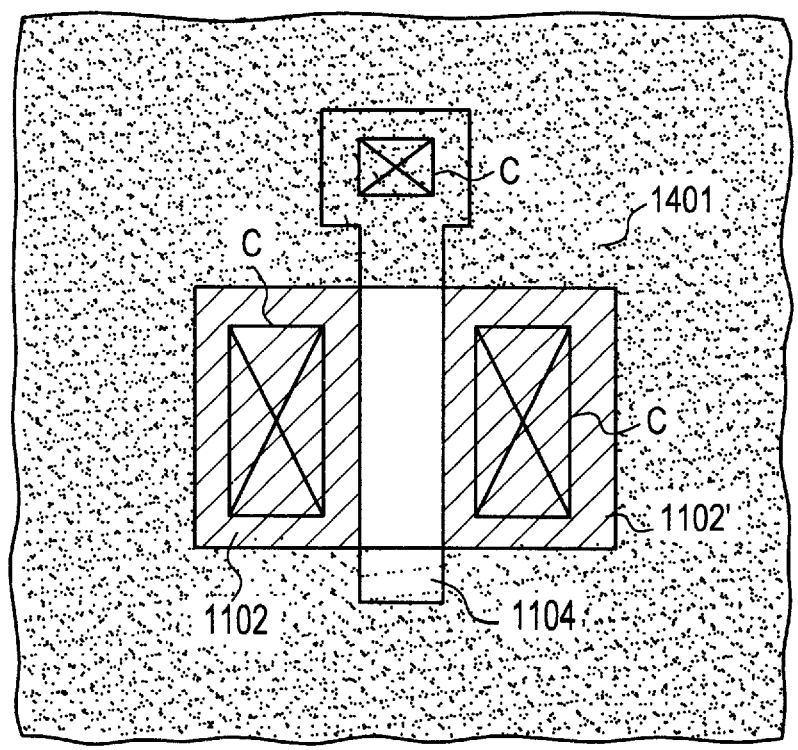

FIG. 14 is a diagram showing a plan view of the device shown in FIG. 11a and FIGS. 13a to 13d. The shaded area expresses the platinum silicide film 1102, 1102'. The number 1401 denotes a field oxide region. FIG. 14 also shows contact holes C to which Al electrodes are attached.

In the embodiment described above, platinum silicide films 1102, 1102' were used for the source and drain regions. However, the material is not restricted to platinum silicide. Other silicides or metals may be used.

Figure 15A:
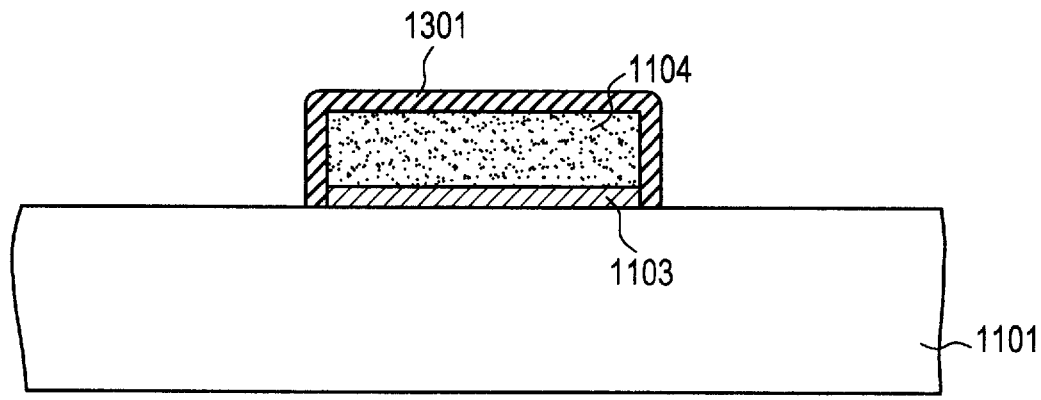
FIGS. 15a to 15c are diagrams showing cross-sectional views of an example of manufacturing steps for a resonant tunneling device of the present invention.
Figure 15B:
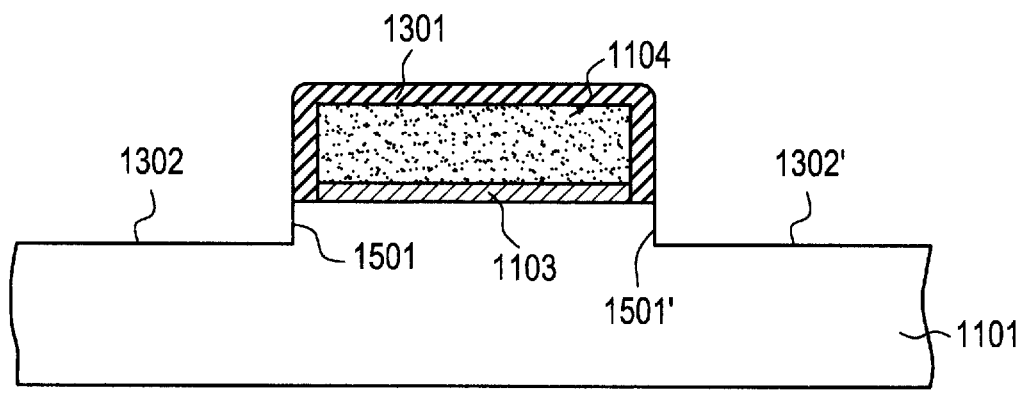
Figure 15C:
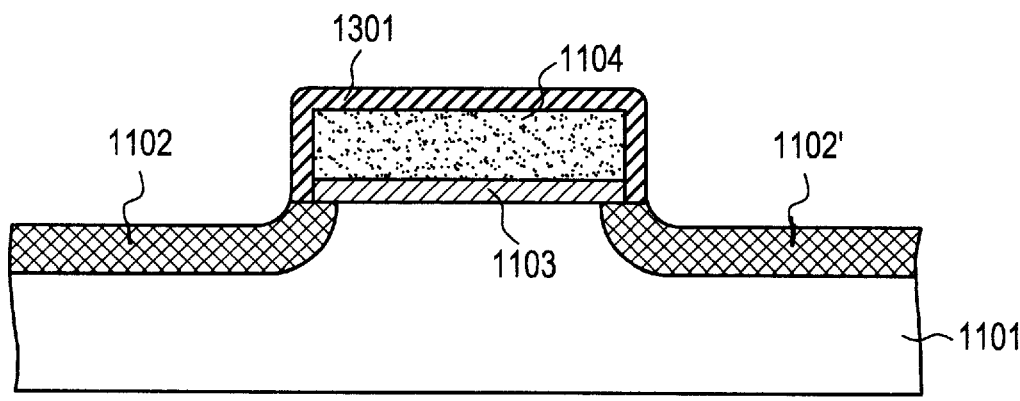

FIGS. 15a to 15c show another embodiment of the present invention for the manufacture of the structure of FIG. 11a.

The structure shown in FIG. 15a, in which an SiO$_2$ film of 200 Å~300 Å thickness covers a poly Si gate electrode 1104, is obtained by the same manufacturing steps described in FIGS. 13a to 13c.

After forming the structure of FIG. 15a, the surface of the Si substrate 1101 is etched by amisotropic etching, for instance, by RIE, thus forming grooves 1501, 1501' as shown in FIG. 15b. Then, platinum silicide films 1102, 1102' are formed at the expose surface 1302, 1302' of the Si substrate 1101 in a manner similar to that shown in FIGS. 13c to 13d. Here, by setting the thickness of the platinum silicide films 1102, 1102' at 1500 Å~2000 Å, the interface between platinum silicide 1102, 1102' and the Si substrate 1101 encroaches beneath the gate electrode 1104, by an amount of 700 Å~1000 Å as compared with the initial Si surface.

In the embodiment of the present invention described in FIGS. 15a to 15c, the method for etching the Si substrate 1101 is depicted as a method of etching Si substrate 1101 perpendicularly by RIE. However, the grooves may be formed having a tapered angle using RIE. Moreover, the isotropic etching method may be used.

Figure 16:
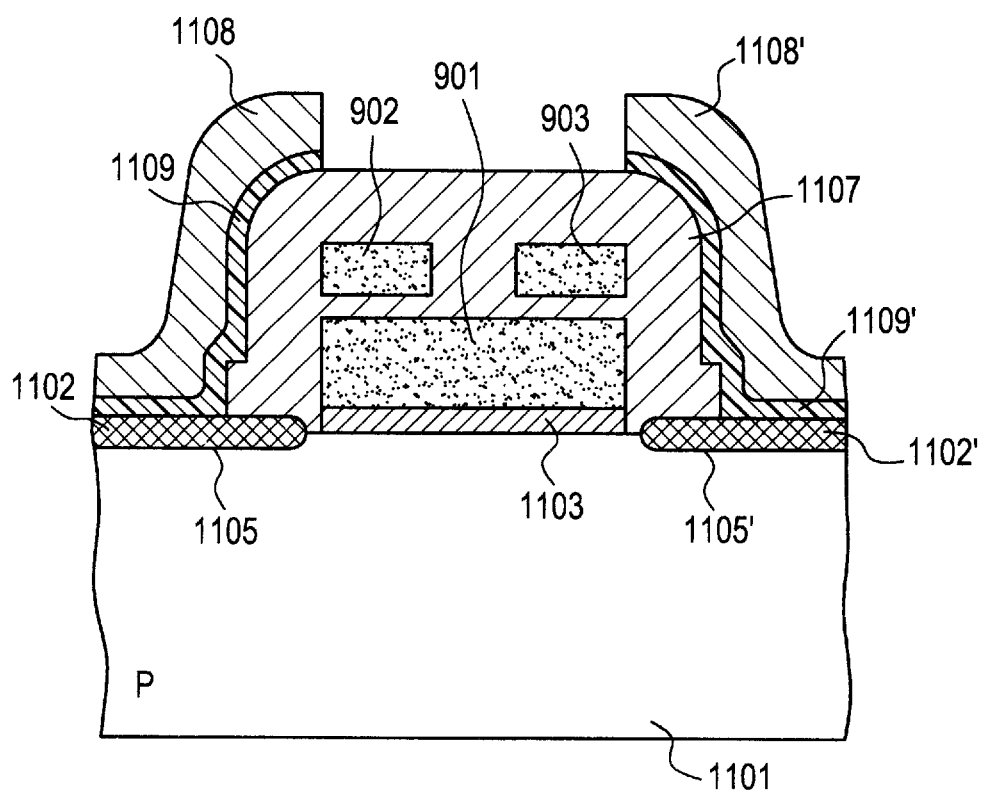
FIG. 16 is a diagram showing another embodiment of a Shottoky barrier type.

FIG. 16 is a diagram showing another embodiment of a resonant tunneling device. This device is similar to that of FIG. 11a but incorporates control gates 902, 903, and floating gate electrode 901 of FIG. 9a. This device is used for the same applications shown in FIGS. 9b to 9c.

Figure 17:
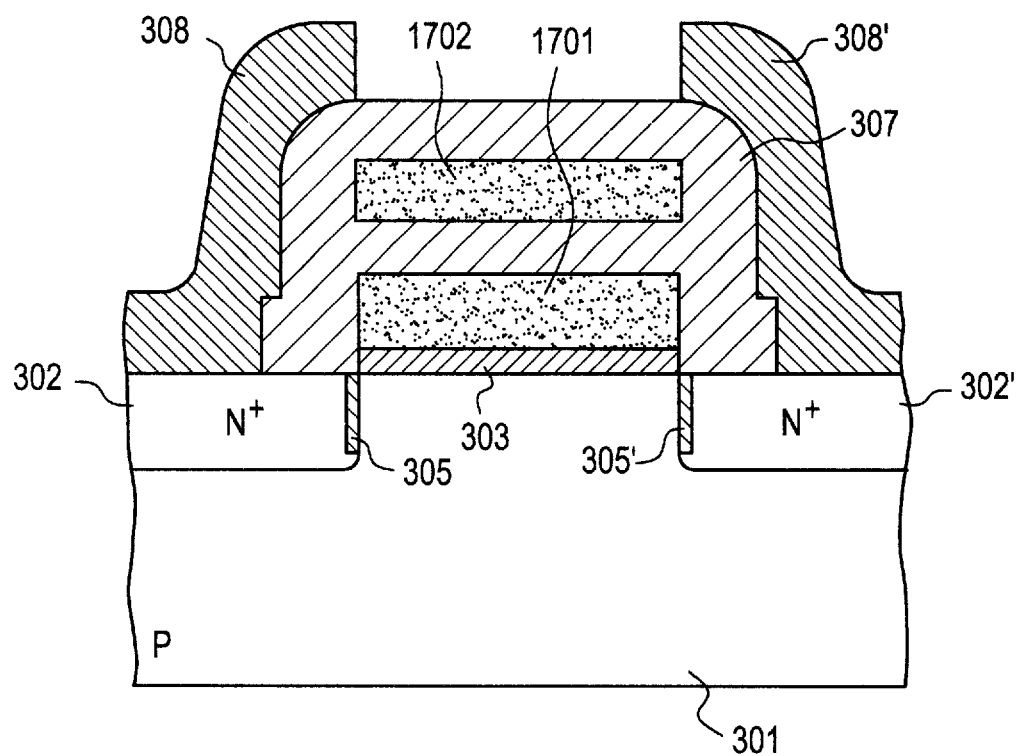
FIG. 17 and 18 are diagrams showing another embodiment of the present invention having a floating gate electrode and a control gate electrode.

FIG. 17 is a modification of an embodiment of the device shown in FIG. 3a. The device of FIG. 17 has a floating gate electrode 1701 and a control gate electrode 1702. The coupling capacitance $C_1$ between floating gate electrode 1701 and a Si substrate 301 is made larger than the coupling capacitance $C_2$ between control gate electrode 1702 and floating gate electrode 1701. This can be achieved by making the thickness of SiO$_2$ film 307, positioned between control gate electrode 1702 and floating gate electrode 1701, thicker than the thickness of gate oxide film 303. According to the embodiment shown in FIG. 17, the voltage applied to the control gate electrode 1702 for controlling the height of the energy levels in the channel region is made larger than that of FIG. 3a.

Figure 18:
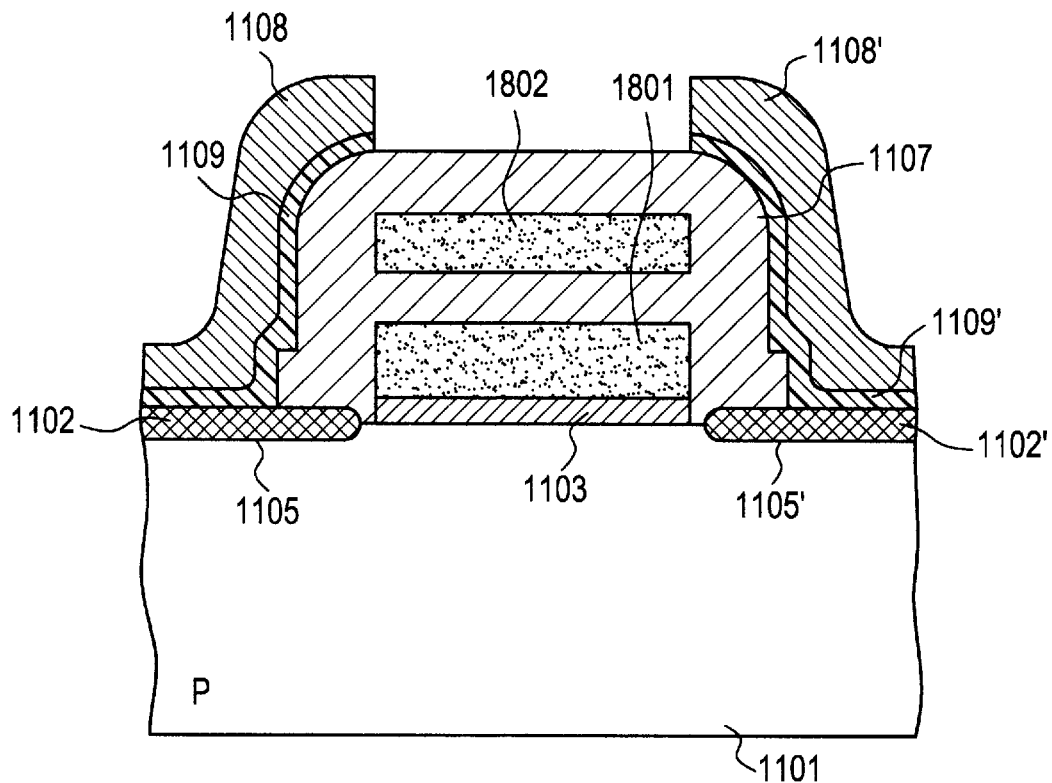

FIG. 18 is a similar structure to FIG. 17 and shows a floating gate electrode 1801 and a control gate electrode 1802. This embodiment corresponds to the device shown in FIG. 11a.

Figure 19:
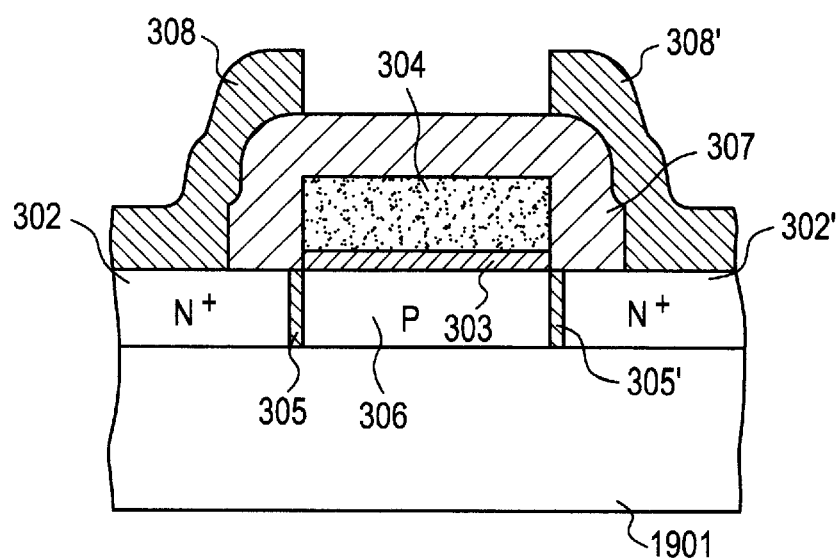
FIG. 19 is a diagram showing another embodiment of the present invention, in which a resonant tunneling device is formed on an insulating base.

FIG. 19 is another embodiment in which an insulating base 1901, such as sapphire, is used and oxide films 305, 305' shown in FIG. 3a extend to the insulating base 1901. This invention is not restricted to the embodiments described above.

For instance, although n-channel devices were described, the present invention can be applied to p-channel devices. Further, at the surface of the channel region, impurities having the same conductivity type or opposite conductivity type as compared with the Si substrate may be doped. Moreover, as for the material of the gate electrode, other metals or silicides may be used. Further, one may manufacture the resonant tunneling device on a GaAs substrate instead of a Si substrate.

Concerning the material for providing Shottoky barriers, PtSi was used. However, materials such as the metals Pt, Pd, Ni, Mo, W, Nb, Ta, Ti, etc. or their silicides may be used.

Further, a gate structure other then the MIS structure (metal-insulator-semiconductor) may be adopted. For instance, a Shottoky gate structure in FIG. 16.

Other modifications and improvements of the invention may be apparent to one skilled in the art, and the invention is intended to cover such modifications and improvements as defined by the appended claims.

What is claimed is:

1. A semiconductor device, comprising:
   a semiconductor substrate;
   a source region and drain region, each formed at the surface of said semiconductor substrate, said source and drain regions each having a potential barrier with respect to said semiconductor substrate; and
   a gate electrode formed on said semiconductor substrate positioned between said source and drain regions, a region between said source and drain regions having a sufficiently small channel length so as to permit a resonant tunneling current flow therethrough, said gate electrode controlling the height of discrete energy levels of carriers of said semiconductor substrate, wherein a conduction state and a non-conduction state of said device depends on the existence or non-existence of the resonant tunneling current flow between said source and drain regions as determined by said discrete energy levels, wherein said potential barriers are provided by tunneling insulating films formed between said source and drain regions and portions of said semiconductor substrate positioned between said source and drain regions, wherein the thickness of each of said tunneling insulating films is not larger than 40 Å and wherein said tunneling insulating films are selected from silicon oxide films, silicon nitride films and Aluminum oxide films.

2. A semiconductor device according to claim 1, wherein a voltage applied to said drain region is larger than that of said source region.

3. A semiconductor device according to claim 1, wherein the channel length is not larger than 0.1 $\mu$m.

4. A semiconductor device according to claim 1, further comprising a gate insulating film formed beneath said gate electrode.

5. A semiconductor device according to claim 1, wherein said tunneling insulating films extend only on side portions of said source and drain regions.

6. A semiconductor device according to claim 1, wherein said semiconductor substrate is a p-type Si substrate.

7. A semiconductor device according to claim 1, wherein said source and drain regions comprise $n^+$-type poly Si regions.

8. A semiconductor device according to claim 7, wherein impurities of said $n^+$-type poly Si regions are diffused into said semiconductor substrate, providing PN junctions in said semiconductor substrate.

9. A semiconductor device according to claim 1, further comprising a source electrode and a drain electrode electrically connected to said source and drain regions.

10. A semiconductor device according to claim 1, further comprising a resistor having a first and second terminal, said first terminal being connected to said drain region and said second terminal being connected to a voltage source, said gate electrode being supplied with an input signal, and said first terminal of said resistor providing an output signal.

11. A semiconductor device according to claim 1, wherein said tunneling insulating films extend from the surface of said semiconductor substrate to a depth deeper than that of said source and drain regions.

12. A semiconductor device according to claim 1, wherein said tunneling insulating films surround the side walls and bottom surface of said source and drain regions.

13. A semiconductor device according to claim 1, wherein said tunneling insulating films are formed on the surface of said semiconductor substrate, and said source and drain regions are formed on said insulating films.

14. A semiconductor device according to claim 13, wherein said source and drain regions contact said semiconductor substrate and form PN junctions with said semiconductor substrate.

15. A semiconductor device according to claim 13, further comprising thick insulating films, each formed on said substrate wherein said source and drain regions extend over said thick insulating films.

16. A semiconductor device according to claim 1, wherein said source and drain regions are made from conductive films.

17. A semiconductor device according to claim 16, further comprising:
    metal films formed on said source and drain regions; and
    Al electrodes formed on said metal electrodes.

18. A semiconductor device according to claim 16, further comprising an insulating film covering said gate electrode wherein said source and drain regions are made from conductive films adjacent said insulating films.

19. A semiconductor device according to claim 16, wherein said conductive films are selected from metal silicide or other metals.

20. A semiconductor device according to claim 1, further comprising an insulating base on which said semiconductor substrate is formed.

21. A semiconductor device according to claim 1, wherein said gate electrode comprises a floating gate, and a pair of control gate electrodes capacitance-coupled with said floating gate.

22. A semiconductor device according to claim 21, further comprising a resistor, one side of said resistor being connected to said drain region and the other side being connected to a voltage source having a higher voltage than that applied to said source region, said control gate electrodes having input signals independently applied thereto, and the connected point of said resistor and said drain region providing an output signal.

23. A semiconductor device according to claim 1, wherein said gate electrode comprises a floating gate and a control gate electrode capacitance-coupled with said floating gate, the capacitance between said control gate electrode and said floating gate being smaller than that between said floating gate electrode and said semiconductor substrate.

* * * * *